(12) United States Patent
Spikes, Jr.

(10) Patent No.: US 6,599,174 B1
(45) Date of Patent: Jul. 29, 2003

(54) ELIMINATING DISHING NON-UNIFORMITY OF A PROCESS LAYER

(75) Inventor: Thomas E. Spikes, Jr., Round Rock, TX (US)

(73) Assignee: Advanced Micro Devices, Inc., Austin, TX (US)

( * ) Notice: Subject to any disclaimer, the term of this patent is extended or adjusted under 35 U.S.C. 154(b) by 98 days.

(21) Appl. No.: 09/843,996

(22) Filed: Apr. 27, 2001

(51) Int. Cl.[7] ................................................. B24D 1/00
(52) U.S. Cl. .................................. 451/57; 451/5; 451/8; 451/21; 451/41; 451/56; 451/285; 451/287; 451/288; 451/443; 451/444
(58) Field of Search ........................... 451/5, 8, 21, 41, 451/56, 57, 285, 287, 288, 443, 444, 1

(56) References Cited

U.S. PATENT DOCUMENTS

| | | | | |
|---|---|---|---|---|
| 4,680,893 A | * | 7/1987 | Cronkhite et al. | 451/57 |
| 6,241,585 B1 | * | 6/2001 | White | 451/41 |
| 6,261,157 B1 | * | 7/2001 | Bajaj et al. | 451/57 |
| 6,335,286 B1 | * | 1/2002 | Lansford | 438/692 |

* cited by examiner

Primary Examiner—Joseph J. Hail, III
Assistant Examiner—Shantese McDonald
(74) Attorney, Agent, or Firm—Williams, Morgan & Amerson, P.C.

(57) ABSTRACT

A method includes providing at least one wafer having a process layer formed thereon. A surface of the process layer is polished using a first polishing process that is comprised of a slurry and a first polishing pad. The slurry is removed from the surface of the process layer. The surface of the process layer is planarized using a substantially slurryless second polishing process that is comprised of a second polishing pad that is more abrasive than the first polishing pad. A system includes a polishing tool and a process controller. The polishing tool is adapted to receive at least one wafer having a process layer formed thereon. The polishing tool is a adapted to polish a surface of the process layer using a first polishing process that is comprised of a slurry and a first polishing pad and remove the slurry from the surface of the process layer. The polishing tool is adapted to planarize the surface of the process layer using a substantially slurryless second polishing process that is comprised of a second polishing pad that is more abrasive than the first polishing pad. The process controller is coupled to the polishing tool and is adapted to communicate with at least one of a slurry controller and the polishing tool.

34 Claims, 8 Drawing Sheets

ELIMINATING DISHING NON-UNIFORMITY OF A PROCESS LAYER

BACKGROUND OF THE INVENTION

1. Field of the Invention

This invention relates generally to semiconductor processing, and more particularly, to eliminating dishing non-uniformity of a process layer, formed above a surface of a wafer.

2. Description of the Related Art

CMP is a widely used means of planarizing silicon dioxide as well as other types of processing layers on semiconductor wafers. Chemical mechanical polishing typically utilizes an abrasive slurry disbursed in an alkaline or acidic solution to planarize the surface of the wafer through a combination of mechanical and chemical action. Generally, a chemical mechanical polishing tool includes a polishing device positioned above a rotatable circular platen or table on which a polishing pad is mounted. The polishing device may include one or more rotating carrier heads to which wafers may be secured, typically through the use of vacuum pressure. In use, the platen may be rotated and an abrasive slurry may be disbursed onto the polishing pad. Once the slurry has been applied to the polishing pad, a downward force may be applied to each rotating carrier head to press the attached wafer against the polishing pad. As the wafer is pressed against the polishing pad, an exposed surface, i.e., polishing surface, of a process layer formed above a surface of the wafer is mechanically and chemically polished.

As semiconductor devices are scaled down, the importance of chemical mechanical polishing to the fabrication process increases. In particular, it becomes increasingly important to control and minimize within-wafer topography variations, i.e., it is desirable for a post-polish surface of a process layer to be as planar as possible. Moreover, depending upon the particular process, if a post-polish surface of a process layer is not sufficiently planar, subsequent processing steps may be undesirably affected. For example, in one embodiment, to minimize spatial variations in downstream photolithography and etch processes, it is necessary for the thickness of an oxide layer, formed above a surface of a wafer, to be as uniform as possible Those skilled in the art will appreciate that a variety of factors may contribute to producing surface non-uniformity, such as dishing, in a process layer. In one embodiment, a process layer may be formed above a surface of a substrate, e.g., a wafer, or a previously formed process layer. During formation, the process layer may conform to the topography of the substrate and, if the surface of the substrate is non-uniform, the process layer may exhibit the same type of surface non-uniformity. For example, if the surface of the substrate is dished, a corresponding surface of the process layer may also be dished.

Typically, CMP is used to planarize a non-uniform polishing surface of a process layer, i.e., CMP may be used to reduce surface variations in a pre-polish surface of the process layer. For example, CMP may be used to remove or at least partially reduce the severity of dishing non-uniformity of the process layer. In one embodiment, during a polishing process, the thicker portions of the process layer may shield the dished areas of the process layer from the polishing pad, and as a result, the polish removal rate may be greater for the thicker portions of the process layer as compared to the dished areas. This difference in polish removal rate may be used, during the polishing process, to produce a more planar post-polish surface of the process layer.

Unfortunately, with severe surface non-uniformity, e.g., severe dishing of the process layer, conventional CMP may not be capable of adequately planarizing the polishing surface of the process layer. For example, the dished portions of the process layer may be too severe to be corrected by changes in the polish removal rate. Moreover, the slurry used during the polishing process may react with the entire polishing surface of the process layer, and the thinner dished portions of the process layer may be at least partially abraded by the chemical action of the slurry, even though shielded from the polishing pad by the thicker portions of the process layer. Depending upon the application, any residual uncorrected non-uniformity remaining on a post-polish surface of a process layer may contribute to impaired final device performance or complete device failure.

The present invention is directed to overcoming, or at least reducing the effects of, one or more of the problems set forth above.

SUMMARY OF THE INVENTION

In one aspect of the present invention, a method is provided. The method includes providing at least one wafer having a process layer formed thereon. A surface of the process layer is polished using a first polishing process that is comprised of a slurry and a first polishing pad. The slurry is removed from the surface of the process layer. The surface of the process layer is planarized using a substantially slurryless second polishing process that is comprised of a second polishing pad that is more abrasive than the first polishing pad.

In another aspect of the present invention, a system is provided. The system includes a polishing tool and a process controller. The polishing tool is adapted to receive at least one wafer having a process layer formed thereon. The polishing tool is a adapted to polish a surface of the process layer using a first polishing process that is comprised of a slurry and a first polishing pad and remove the slurry from the surface of the process layer. The polishing tool is adapted to planarize the surface of the process layer using a substantially slurryless second polishing process that is comprised of a second polishing pad that is more abrasive than the first polishing pad. The process controller is coupled to the polishing tool and is adapted to communicate with at least one of a slurry controller and the polishing tool.

BRIEF DESCRIPTION OF THE DRAWINGS

The invention may be best understood by reference to the following description taken in conjunction with the accompanying drawings, in which like reference numerals identify like elements, and in which.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention is directed to a CMP process that uses a second polishing processes to planarize a polishing surface of a process layer. In disclosing the present invention, reference will be made to the illustrative embodiment of the invention depicted in FIGS. 1–7. The relative sizes of the various features depicted in the drawings may be exaggerated or reduced as compared to the size of those feature sizes on actual devices. Nevertheless, the attached drawings are included to aid in obtaining an understanding of the present invention.

Figure 1:
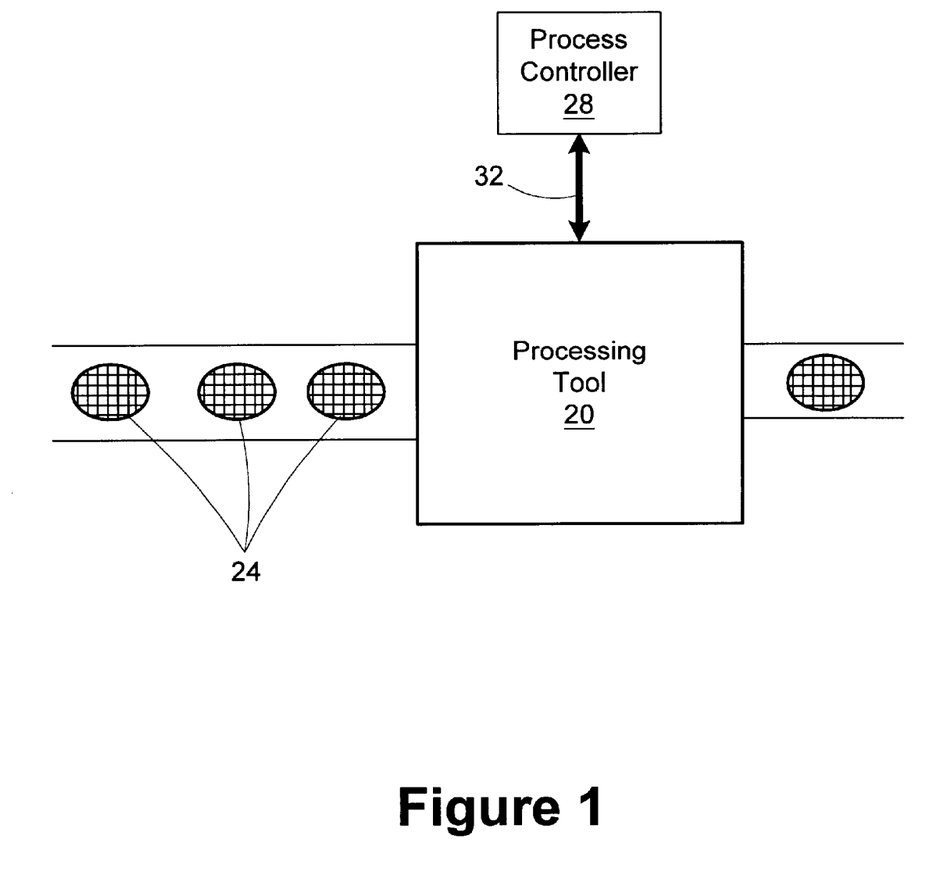
FIG. 1 is a simplified block diagram of a processing tool used to manufacture semiconductor devices.

Referring to FIG. 1, an exemplary processing tool 20 is shown. The processing tool 20 may be used as one part of a fabrication process to manufacture semiconductor wafers 24 into functional semiconductor devices. The processing tool 20 may be controlled by a process controller 28 that may send a plurality of control signals to the processing tool on a control line 32. The process controller 28 may be comprised of a variety of devices. For example, in one embodiment, the process controller 28 may be a controller embedded inside the processing tool 20 and communicate with the processing tool 20 using protocols and interfaces provided by the manufacturer. Alternatively, the process controller 28 may be connected to a larger network of controllers and communicate with the processing tool 20 through an Advanced Process Control (APC) framework interface. For example, the processing tool 20 may be coupled to an equipment interface (not shown) that retrieves various operational data from the processing tool 20 and communicates this data to the Advanced Process Control (APC) framework. Moreover, in response to the operational data, the equipment interface may receive control signals from the APC framework that may be used to control the processing tool 20.

The semiconductor wafers 24 are generally processed in batches, which are commonly referred to as lots or batch processing. For example, a lot of wafers 24 may be comprised of twenty-five wafers. The wafers 24 within a lot progress through the manufacturing process together in an attempt to subject the wafers 24 to substantially the same manufacturing conditions, such that the resulting semiconductor devices have substantially the same performance characteristics, e.g., speed, power, etc.

Figure 2:
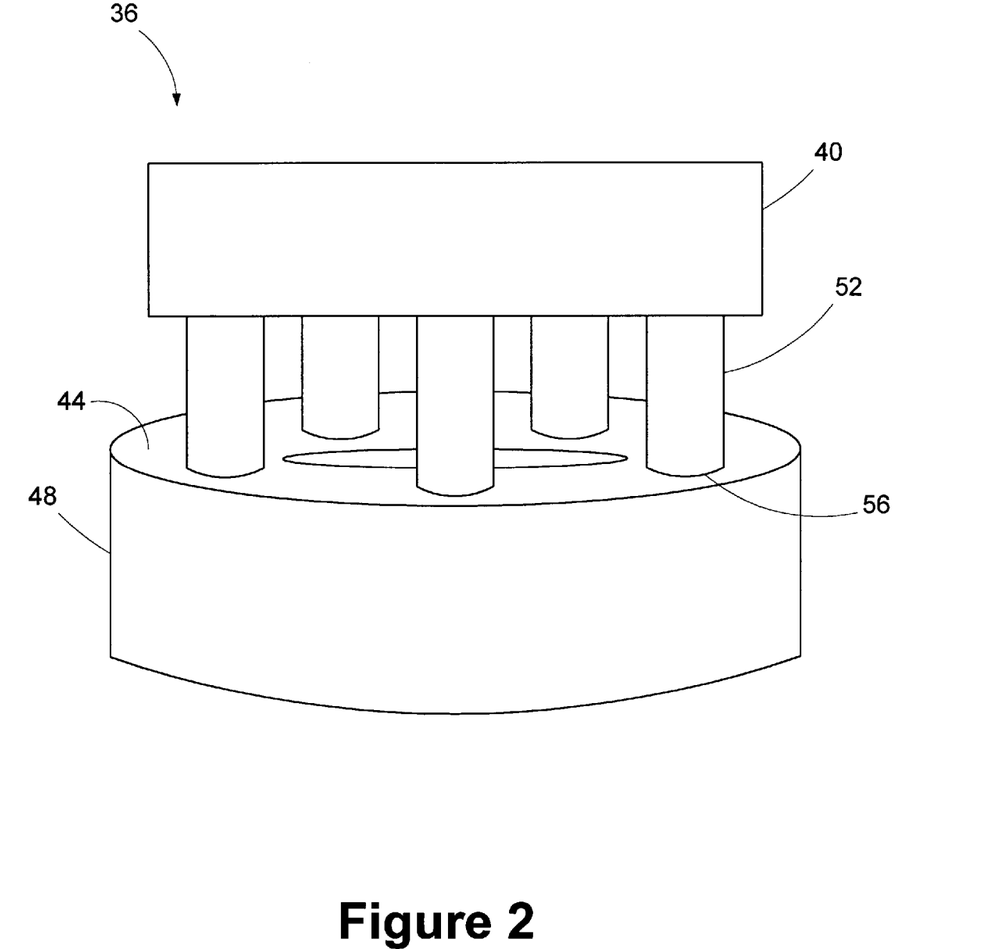
FIG. 2 illustrates a conventional polishing tool having multiple arms.

Referring to FIG. 2, an exemplary multiple arm polishing tool 36 is shown. The exemplary polishing tool 36 may be comprised of a multi-head carrier 40 positioned above a polishing pad 44 that is mounted on a rotatable platen 48. The multi-head carrier 40 typically includes a plurality of rotatable polishing arms 52, each of which includes a carrier head 56. Wafers (not shown) may be secured to the carrier heads 56 using known techniques, such as vacuum pressure. A source of polishing fluid (not shown) may be provided to supply polishing fluid, e.g., slurry, to the polishing pad 44. Furthermore, although five polishing arms 52 are shown, the polishing tool 36 may be comprised of any number of polishing arms 52. For example, in one embodiment, the polishing tool 36 is comprised of only a single polishing arm 52, and each wafer is polished individually.

Figure 3:
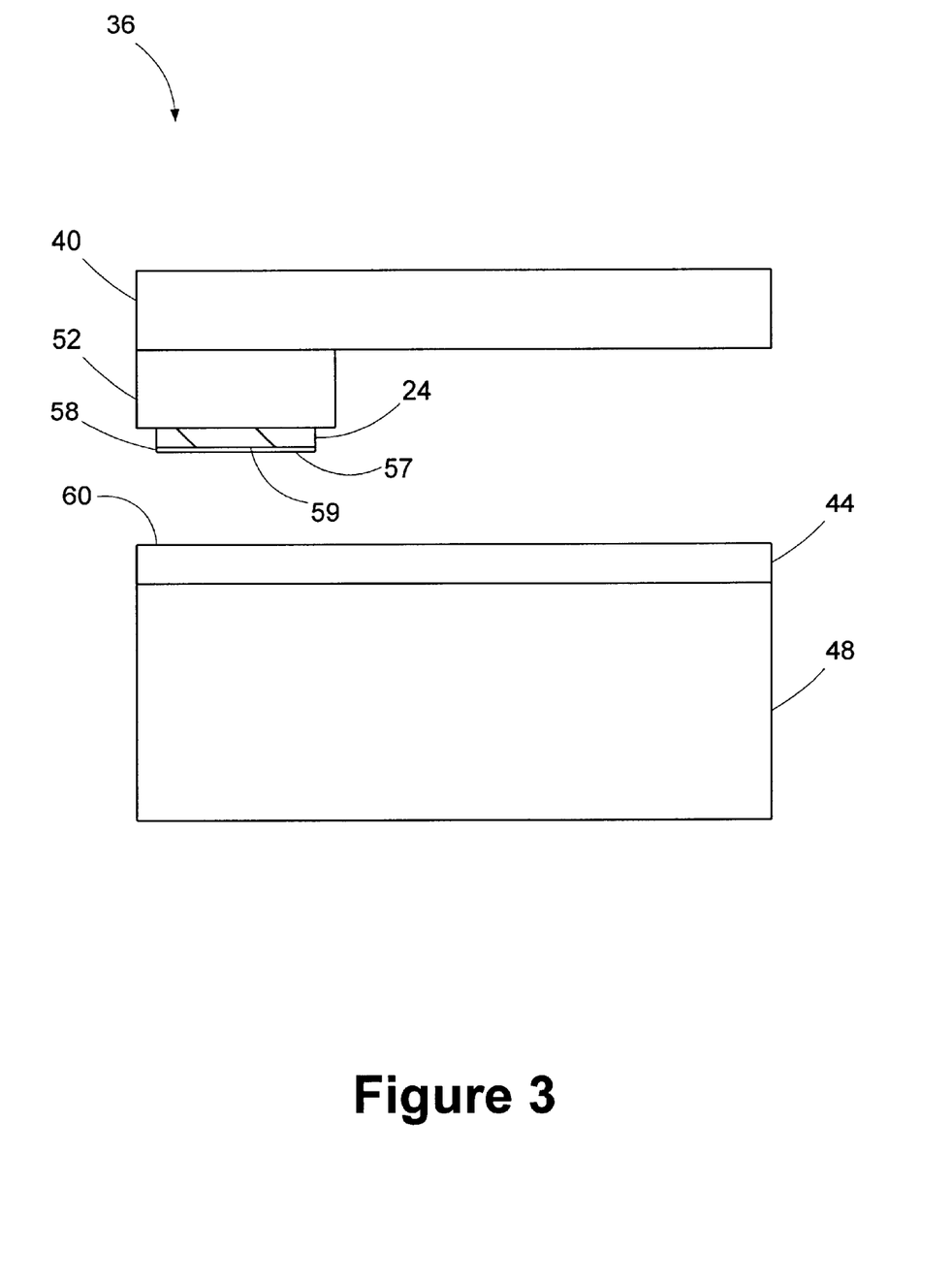
FIG. 3 is a simplified side view of the polishing tool illustrated in FIG. 2.

Referring to FIG. 3, a simplified side view of the illustrative polishing tool 36 is shown. To simplify understanding the operation of the polishing tool 36, only one polishing arm 52 is illustrated. Again, the polishing pad 44 may be fixed to the rotatable platen 48. A wafer 24 is connected to the rotatable polishing arm 52, using, for example, vacuum pressure, and the polishing arm 52 may be connected to the carrier 40. To effectuate polishing, the polishing arm 52 may be extended such that a polishing surface 57 of a process layer 58 formed above a surface 59 of the wafer 24 is pressed against a polishing surface 60 of the polishing pad 44. Furthermore, the platen 48 may be rotated, typically at a constant speed. Moreover, a variable downward force may be applied to the polishing arm 52, and the polishing arm 52 may be rotated and oscillated back and forth across the polishing pad 44.

For ease of illustration, the present invention is described with reference to polishing the process layer 58. However, the present invention should not be construed as being limited to polishing a single process layer 58 formed above a surface 59 of a wafer 24. For example, in a second embodiment, if no process layers 58 are present, the surface 59 of the wafer 24 may be polished in a similar manner as described above. Moreover, in another embodiment, depending upon the process, many process layers 58 may be formed above the surface 59 of the wafer 24, and any exposed portions of the process layers may be polished.

Figure 4:
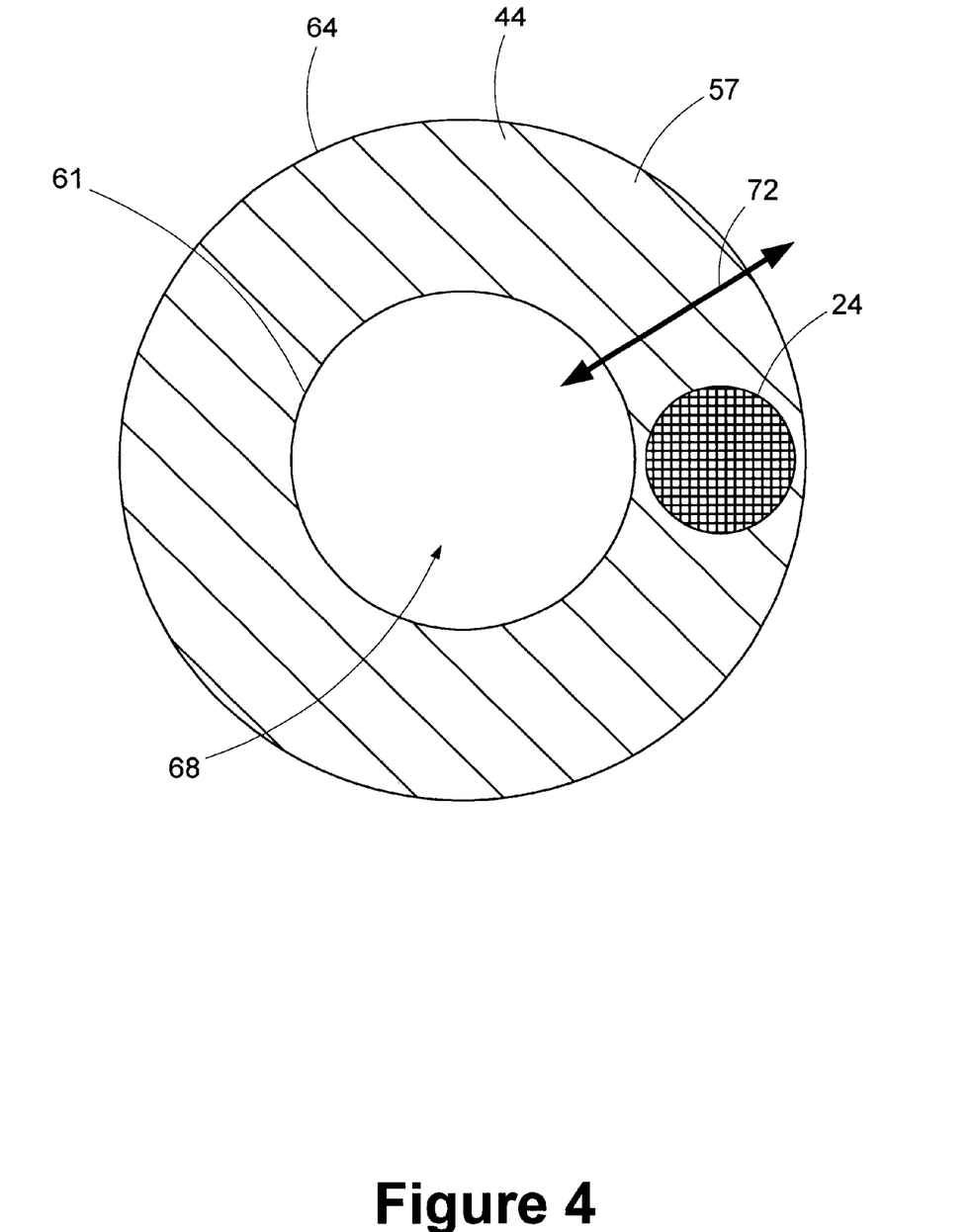
FIG. 4 is a simplified top view of the polishing tool shown in FIG. 2.

Referring to FIG. 4, a top view of the polishing pad 44, illustrated in FIGS. 2 and 3, is shown. The polishing pad 44 may include an inner edge 61, an outer edge 64, and have an opening 68 positioned therein. Moreover, the wafer 24 is shown positioned against the polishing pad 44 between the inner and outer edge 61, 64. For simplicity, the polishing arms 52 and other elements of the polishing tool 36 are not shown. In addition, those skilled in the art will appreciate that a plurality of wafers 24 may be polished at the same time, and that FIG. 4 is a simplified view of the polishing pad 44.

During the polishing process, the wafer 24 may oscillate back and forth across the polishing pad 44. The direction of the oscillation is indicated by arrow 72. Normally, the oscillation length may be adjusted such that a portion of the wafer 24 moves slightly off the inner edge 61 of the polishing pad 44 at the minimum point of oscillation and slightly off the outer edge 64 of the polishing pad 44 at the maximum point of oscillation. Moreover, the oscillation length may be adjusted, and by increasing or decreasing the portion of the wafer 24 that moves off of the polishing pad 44 at the minimum and maximum points of oscillation, the center-to-edge polish rate may be adjusted.

Typically, during a polishing process, the polishing slurry is dispersed onto the polishing surface 57 of the polishing pad 44. Once the slurry is deposited onto the polishing pad 44, the chemical and mechanical properties of the slurry may be used to abrade a polishing surface 57 of a process layer 58 formed above the wafer 24 (illustrated in FIG. 3). For example, depending upon the polishing process, the interaction between the process layer 58, the polishing pad 44, and the abrasive particles within the slurry may be used to mechanically abrade at least a portion of the polishing surface 57 of the process layer 58 formed on the wafer 24.

As the wafers 24 are polished, the slurry may be gradually captured, filtered and, re-circulated back into the polishing process as part of a slurry re-circulation loop (not shown). The slurry re-circulation loop may be used to maintain a desired abrasive particle size within the slurry. For example, by filtering the slurry, large groupings of abrasive particles that have become "clumped" together may be removed from the slurry. If not removed, these large groupings of particles may scratch or otherwise damage the polishing surface 57 of the process layer 58. In addition, the slurry re-circulation may be used to recapture the slurry from the polishing process. For example, as will be described below, the slurry re-circulation loop may be used to remove the slurry from the polishing process, and once the slurry is removed, the polishing surface 57 of the process layer 58 may be planarized using a slurryless second polishing process.

Figure 5:
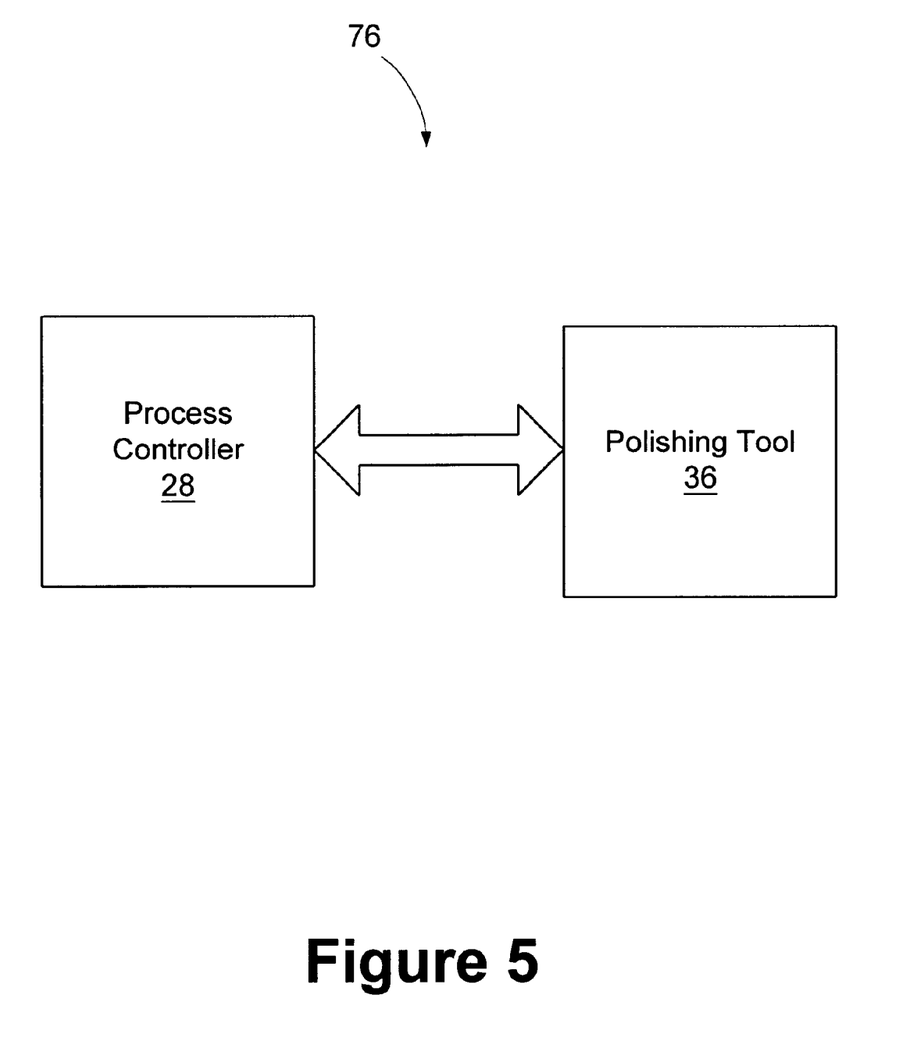
FIG. 5 is an exemplary control system for the polishing tool shown in FIG. 2.

Referring to FIG. 5, an exemplary control system 76 for the polishing tool 36 is shown. Generally, a variety of control systems may be used with the present invention. Furthermore, because any number control systems may be implemented, the exemplary control system 76 described herein should not be considered as a limitation of the present invention.

In this illustrative embodiment, the control system 76 may be comprised of the process controller 28, the polishing tool 36, and a slurry controller 80. The process controller 28 may be coupled to the polishing tool 36, which may be capable of communicating with the slurry controller 80. Alternatively, in other embodiments, the process controller 28 may communicate directly with the slurry controller 80 or any other device that may be controlling various processing characteristics of the slurry. Furthermore, the process controller 28 may be used to implement the appropriate processing parameters for a particular polishing process. For example, the process controller 28 may determine the duration of the polishing process, the angular velocity of the polishing pad 44, the down force of the polishing arms 52, and, as will be described below, planarizing a polishing surface 57 of a process layer 58, during a slurryless polishing process.

In this illustrative embodiment, the slurry controller 80 may be used to initiate capturing and re-circulation of the slurry. For example, at the appropriate time, the slurry controller may implement a slurry capturing process that removes the slurry from the polishing process. Once the slurry is removed, the slurry controller 80 may send a signal to the process controller 28, and the process controller 28 may implement a second polishing process that is directed at planarizing the polishing surface 57 of the process layer 58 (see FIG. 3). Moreover, once the second polishing process is complete, the wafer 24 may be removed from the polishing tool 36, and a second wafer (not shown) may be positioned in the polishing tool 36 for processing. Next, the slurry may be re-circulated back into the polishing process, and the process may be repeated.

Although the slurry controller 80 is illustrated as a separate device, the functionality of the slurry controller 80 may be implemented within one of the other components of the control system 76. For example, the functionality of the slurry controller 80 may be included within the polishing tool 36 and/or the process controller 28. With this illustrative embodiment, the process controller 28 may monitor and control the capturing and re-circulation of the slurry.

In one embodiment, the control system 76 may be implemented using a programmable computer (not shown.) For example, the programmable computer may include a personal computer, a workstation, a network server, a mainframe computer, or the like. The computer may communicate with the polishing tool 36 using a variety of know bus systems, and operate under any suitable operating systems, such as Windows®, MS-DOS, OS/2, UNIX, or the like. Furthermore, the computer may be programmed to execute an application software package whose instructions may be encoded on a computer-readable program storage device, such as a floppy disk. Moreover, the instructions may be included on the hard disk of the computer or other storage medium. More particularly, the computer may be programmed to implement the process of FIG. 6.

Figure 6:
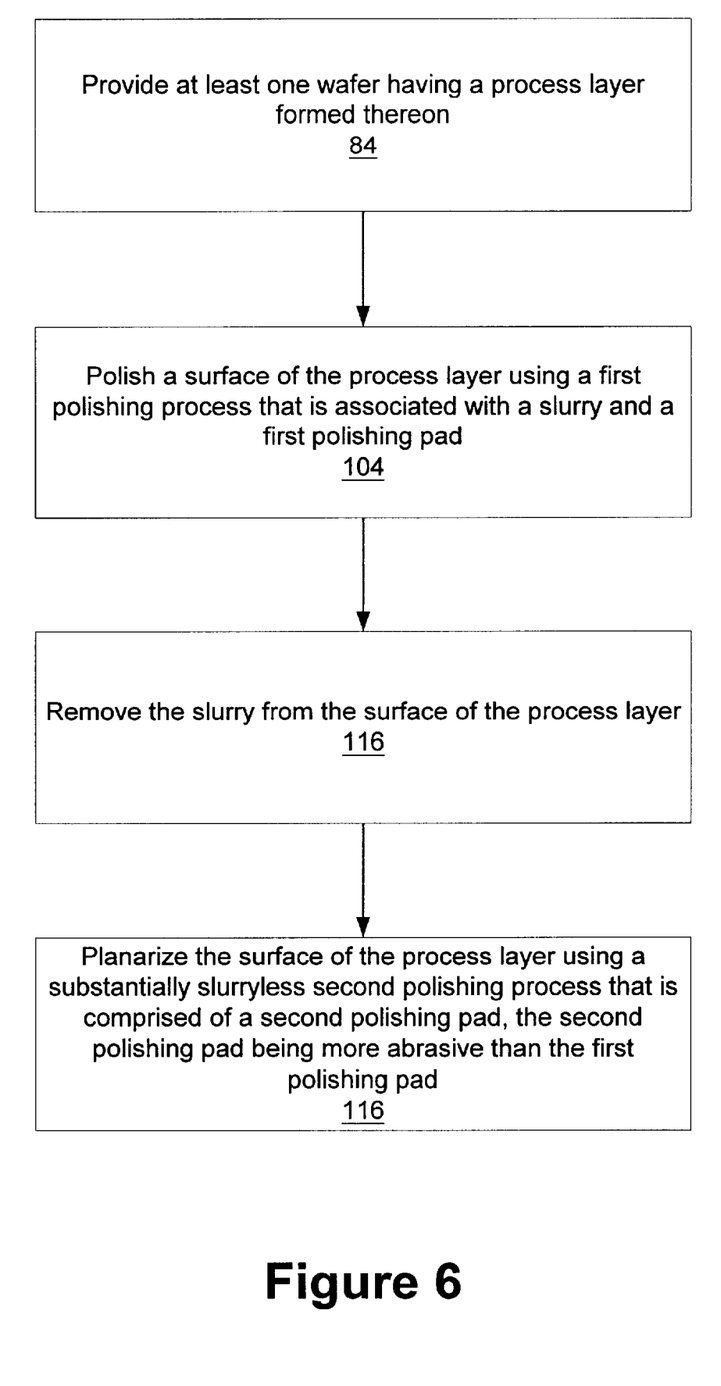
FIG. 6 is a simplified block diagram illustrating one exemplary process for the polishing tool illustrated in FIG. 2 in accordance with one aspect of the present invention.
Figure 7A:
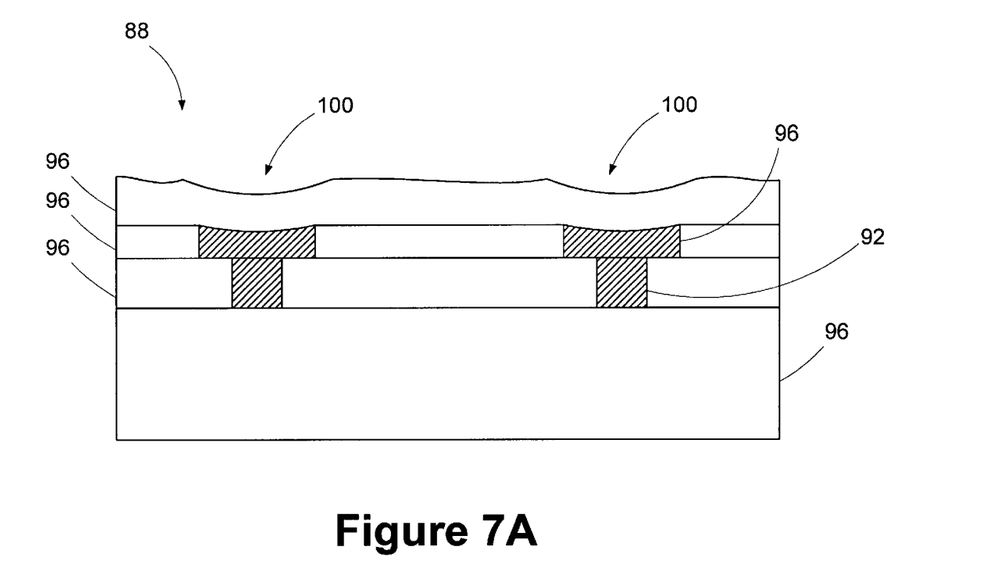
FIGS. 7A–7C are simplified cross-sectional views of a wafer used to illustrate the exemplary process shown in FIG. 6.
Figure 7B:
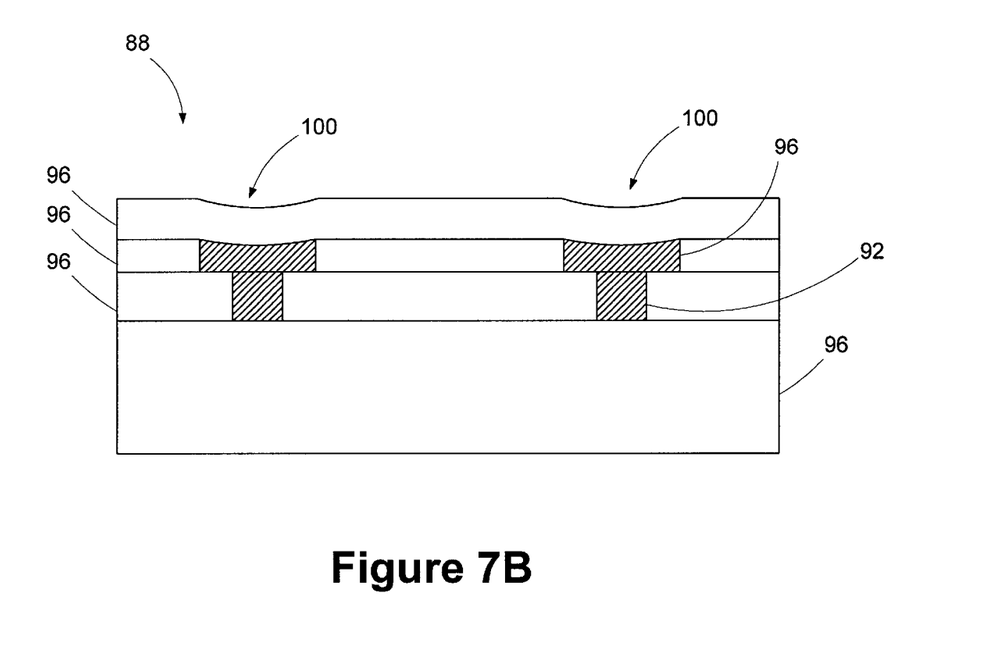
Figure 7C:
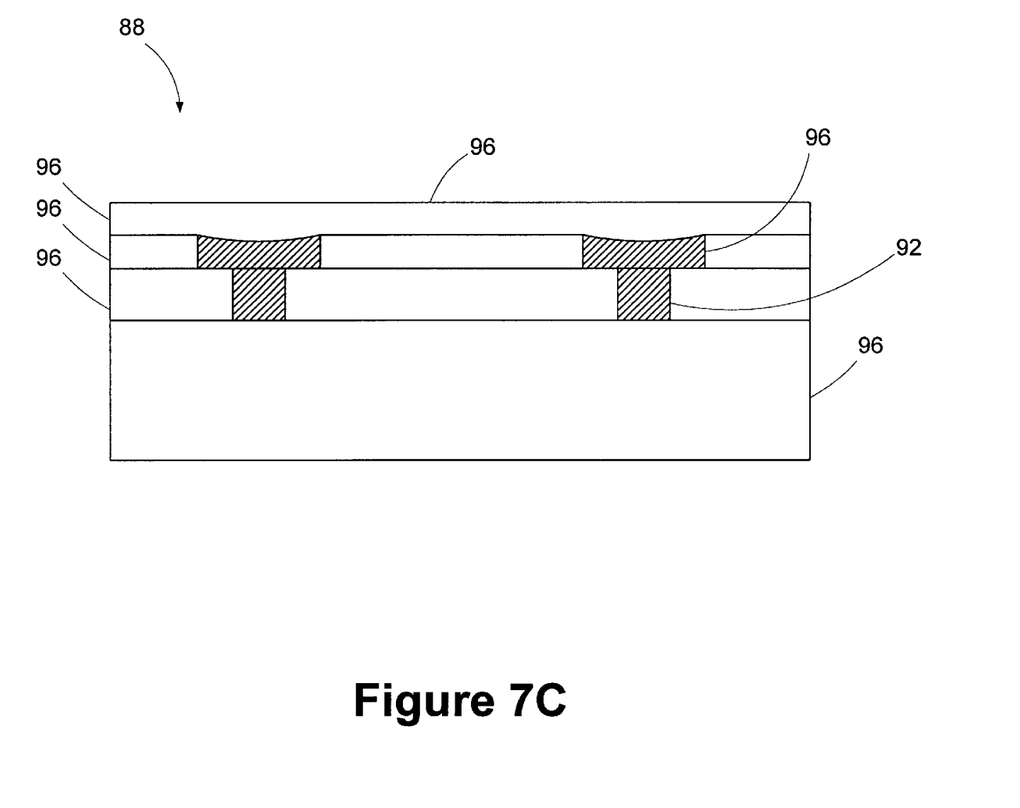

Referring to FIG. 6, an exemplary process for planarizing a polishing surface 57 of a process layer 58 is shown. For ease of illustration and not of limitation, the exemplary process will be described with reference to the control system 76, illustrated in FIG. 5. Moreover, as way of simplification and not of limitation, the process will be described with reference to a cross-sectional embodiment of a wafer 88, which is illustrated in FIGS. 7A–7C.

At block 84, at least one wafer 24 having a process layer 58 formed thereon may be provided for polishing. For example, referring to FIG. 7A, an exemplary cross-section of the wafer 88 is shown. It may be appreciated that FIGS. 7A–7C have been simplified to facilitate an understanding of the present invention. In FIG. 7A, the wafer 88 is comprised of a substrate 92, a first process layer 96, a second process layer 100, and a third process layer 104. The process layers 96, 100, and 104 may be formed above a surface 105 of the substrate 102. Those skilled in the art will appreciate that using various semiconductor processing steps, such as deposition, photolithography, etching, and the like, a plurality of contacts pads 108, interconnects 112, or any other integrated circuit component may be formed adjacent to portions of the first, second, and third process layers 96, 100, and 104.

Generally, the contact pads 108 and the interconnects 112 may be comprised of a variety of materials, such as aluminum, polysilicon, or any other conductive material. Likewise, the process layers 96, 100, and 104 may be comprised of any number of materials, such as silicon dioxide, TEOS, silicon nitride, or any other insulating material. Moreover, the process layers 96, 100, and 104 are commonly referred to as inner layer dielectric layers (ILDs), and these process layers 96, 100, 104 may function to electrically isolate integrated circuit components, e.g., contact pads 108, interconnects 112, and the like.

In one illustrative embodiment, the contact pads 108 are comprised of copper. Moreover, depending upon various processing characteristics, when forming the contact pads 108, a surface 114 of the contact pads 108 may become non-uniform. For example, the non-uniformity of the surface 114 may vary depending upon the width and thickness of the contact pad 108 or any other processing variables, such as composition of the contact pad 108, deposition non-uniformity, etch non-uniformity, and the like. In this embodiment, the surface 114 of the contact pad 108 is dished inward, i.e., the surface 114 of the contact pad 108 is concave.

The first process layer 96 may be formed above a surface 118 of the second process layer 100 and the surface 114 of the contact pads 108. Those skilled in the art will appreciate that a variety of known methods may be used to form the first process layer 96. Typically, during formation, the first process layer 96 may conform somewhat to the topography of the underlying material. In this embodiment, the first process layer 96 is being formed above and adjacent to the surfaces 118, 114 of the second process layer 100 and the contact pads 108, respectively. If the surfaces 118, 114 are non-uniform, the first process layer 96 may exhibit the same type of surface non-uniformity. In this example, because the surface 114 of the contact pads 108 is dished a corresponding pre-polish surface 122 of the first process layer 96 may also be dished. For example, a first and second dishing non-uniformity 126, 130 may be present on the pre-polish surface 122 of the first process layer 96, opposite the plurality of contact pads 108. Moreover, because of natural variations or deviations in the manufacturing process, additional random surface variations may be present on the pre-polish surface 122 of the first process layer 96.

In one embodiment, the surface non-uniformity of the first process layer 96 may be measured and the data from the measurement may be provided to the process controller 28. The surface non-uniformity of the first process layer 96 may be measured using a variety of known techniques. For example, with transparent processing layers, e.g., oxide, polysilicon, silicon nitride, etc., the thickness of the first process layer 96 may be measured using ellipsometry or laser interferometry. Moreover, depending upon the particular process, the thickness of the first process layer 96 may be measured at a statistically sufficient variety of locations, e.g., at nine radial locations across the wafer 88. Alternatively, the first process layer 96 may be visually inspected, and the surface non-uniformity may be manually quantified and provided to the process controller 28. Additionally, a sacrificial wafer may be cross-sectioned at multiple locations, and the non-uniformity of the sacrificial wafer may be measured using a scanning electron microscope (SEM.) Moreover, once measured, the characteristics of the sacrificial wafer may be assumed to be representative for the remaining wafers in the lot. As will be described below, with the measured surface non-uniformity data, the process controller 28 may optimize the polishing process periodically, for a particular batch of wafers, or for each individual wafer.

Referring back to block 84, in FIG. 6, depending upon the manufacturing process, a batch of wafers 24 may be provided. For example, the batch may be comprised of twenty-five production wafers. Moreover, these wafers 24 may be part of an elaborate manufacturing process used to process semiconductor wafers 24 into finished semiconductor devices, e.g., memory chips, microprocessors, and the like. Typically, the polishing of semiconductor wafers 24 may be required many times during the manufacturing process. For example, polishing may be used in conjunction with other semiconductor processes, such as photo-lithography and deposition, to produce desired circuit configurations on the processing surface of a wafer 24.

In another embodiment, monitor wafers, e.g., test wafers (not shown), may be provided for polishing. Monitor wafers may be very similar to production wafers but have some known useful processing property. For example, a desired process layer, such as silicon dioxide, may be deposited with a precise thickness on a surface of the monitor wafers. With this known characteristic, the monitor wafers may be used for determining optimum processing parameters for a polishing process or any other general testing of the polishing tool 36. For example, the monitor wafers may be used to determine the duration of a second polishing process for planarizing a polishing surface of the wafers.

At block 134, the first process layer 96 (shown in FIG. 7A) may be polished using a first polishing process that is comprised of a slurry and a first polishing pad (not shown). For example, referring to FIG. 7B, the first process layer 96 is shown after having been abraded by the first polishing process, which is illustrated by a first post-polish surface 138. With this illustrative embodiment, the first polishing process may be a typical polishing process. For example, slurry may be dispersed onto the first polishing pad, which may be a conventional cast and sliced polyurethane polishing pad 44, and the chemical and mechanical polishing action of the slurry and the first polishing pad may be used to abrade a desired portion of the first process layer 96. In one embodiment, approximately ninety percent of the material to be removed from the first process layer 96 is abraded during the first polishing process, and as will be described below, during a second polishing process, the remaining approximately ten percent of the material may be removed. Of course, any percentage of the first process layer 96 may be removed during the first polishing process, and the percentage of the process layer 96 removed may be selected as a matter of design choice. Moreover, the duration of the first polishing process may be implemented by the control system 76, illustrated in FIG. 5, and in one embodiment, the duration of the first polishing process is approximately 60–90 seconds.

During the first polishing process, random surface variations may be removed from the pre-polish surface 122 of the first process layer 96. For example, after the first polishing process, the first post-polish surface 138 of the first process layer 96 may be substantially more planar than the pre-polish surface 122, except for the first and second surface non-uniformities 126, 130. With some surface non-uniformity, traditional polishing processes may be unable to adequately planarize the first process layer 96. However, as will be described below, surface non-uniformity not removed by the first polishing process may be removed by combining a slurryless second polishing process with the first polishing process.

Referring to FIG. 6, at block 142, the slurry may be removed from the first post-polish surface 138 of the first process layer 96. As described above, the slurry controller 80 may be used along with the slurry re-circulation loop to capture the slurry and remove it from the polishing process. For example, once the first polishing process is complete, the process controller 28 may send a signal to the slurry controller 80, thus, alerting the slurry controller 80 to capture and no longer re-circulate the slurry back to the polishing process. Alternatively, in another embodiment, the wafer 88 may be moved to a secondary platen (not shown), and the second polishing process, described below, may be performed on the slurry free secondary platen. The secondary platen may reside on the same polishing tool 36, or in another embodiment, the secondary platen may reside on an additional polishing tool (not shown). Of course, any other method may be used with the present invention for removing the slurry before processing the wafer 88 through the second polishing process.

At block 144, the first process layer 96 may be planarized using a substantially slurryless second polishing process that is comprised of a second polishing pad (not shown) that is more abrasive than the first polishing pad. As described above, the slurry re-circulation loop may be used to remove the slurry before beginning the second polishing process. However, after removing the slurry, small insignificant traces of slurry may remain on the surface 138 of the process layer 96. Because of these small residual traces of slurry, a completely slurryless environment may not be achieved for the second polishing process. Nonetheless, a significant portion of the slurry is removed, and a substantially slurryless environment may be produced for the second polishing process. Once the slurry is removed, the first polishing pad may be exchanged with the second polishing pad. Alternatively, as described above, the second polishing process may be implemented using a secondary platen, and with this embodiment, the second polishing pad may be mounted to the secondary platen.

Rather than using a traditional cast and sliced polyurethane polishing pad 44, the second polishing pad may be comprised of a more abrasive material such that the first process layer 96 may be abraded, during the second polishing process, without using slurry. Generally, the second polishing pad may be comprised of a variety of materials, and the composition of the second polishing pad may vary depending upon the particular process. In one embodiment, the second polishing pad is comprised of a composite material that at least partially matches the composition of the process layer being polished. For example, when polishing process layers comprised of silicon dioxide, small abrasive silica particles may be embedded within the polishing surface 60 of a conventional polishing pad 44. Alternatively, when polishing process layer comprised of aluminum, small abrasive alumina particles may be embedded within the polishing surface 60 of a conventional polishing pad 44. Of course, any other abrasive material may be used to increase the abrasive characteristics of the second polishing pad.

Typically, because slurry is not being used with the second polishing process, the polish removal rate for the second polishing process is less than the polish removal rate for the first polishing process. Moreover, because of the decrease in polish removal rate and the corresponding decrease in wafer throughput, using only the second polishing process to polish the first process layer 96 may be cost prohibitive. However, by dividing the polishing process into multiple polishing steps, e.g., first and second polishing processes, the first process layer 96 may be planarized without substantially decreasing throughput of the overall polishing process.

Referring to FIG. 7B, the second polishing process may be used to planarize the first post-polish surface 138, thus, at least partially reducing the severity of the first and second dishing non-uniformities 126, 130. During the second polishing process, the lower regions of the first process layer, e.g., the first and second dishing non-uniformities 126, 130, may be shielded from the second polishing pad by the thicker portions of the first process layer 96. Moreover, because slurry is not used during the second polishing process, the thicker portions of the first process layer 96 may be abraded without substantially affecting the lower regions of the first process layer 96.

Referring to FIG. 7C, a second post-polish surface 148 of the first process layer 96 is shown. In this illustrative example, the second polishing process was used to planarize the first process layer 96 by abrading material from the thicker portions of the first process layer 96 without substantially affecting the thickness of the first and second dishing non-uniformities 126, 130, illustrated in FIG. 7B. As described above, the thicker potions of the first process layer 96 may shield or prevent the lower portions of material, e.g., the first and second surface non-uniformities 126, 130) from contacting the second polishing pad, during the second polishing process. As a result, the thicker portions of the first process layer 96 may be abraded away, thus, producing a more planar second post-polish surface 148.

The duration of the second polishing process may be determined as a matter of design choice. Typically, if the topography of a polishing surface, e.g., process layer, wafer surface, etc., is severely non-uniform, the duration of the second polishing process may be increased. Similarly, if the topography of the polishing surface is not severely non-uniform, the duration of the second polishing process may be decreased, thus, increasing throughput of the overall polishing process. As described above, the surface non-uniformity of the polishing surface may be measured, and the process controller 28 may determine the duration of the first and second polishing processes from the measured data. For example, if the measured surface non-uniformity is determined to exceed a predetermined threshold, the duration of the second polishing process may be increased. Alternatively, if the measured surface non-uniformity is determined to be below a predetermined threshold, the duration of the second polishing process may be decreased. In one embodiment, the duration of the second polishing process is approximately 30–60 seconds.

Although only two exemplary polishing processes are described herein, generally, any number of successive polishing processes may be used with the present invention. For example, rather than only using two polishing processes, an additional third polishing process may be used. With this embodiment, once the second polishing process is complete, the wafer 88 may be inspected to ensure a desired uniformity has been achieved with the second polishing process. With reference to the illustrative embodiment described above, if the second post-polish surface 148 of the first process layer 96 is not sufficiently planar, a third polishing process may be used. Moreover, whether slurry is used during the third polishing process, may be determined as a matter of design choice.

Although not required to practice the present invention, once the polishing is complete, on an additional platen (not shown), the process layer 96 may be buffed to remove any residual surface damage or non-uniformity not removed during the first and second polishing processes. For example, referring to FIG. 7d, a post-polish surface 124 of the process layer 96 may be pressed against a buffing wheel (not shown) that has been attached to the additional platen. The rotation of the buffing wheel may be used to alleviate very fine imperfections in the second post-polish surface 148 of the first process layer 96. By using both the second polishing process described herein and the buffing process, a relatively imperfection free processing surface may be obtained.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method comprising:
   providing at least one wafer having a process layer formed thereon;
   polishing a surface of the process layer using a first polishing process that is comprised of a slurry and a first polishing pad;
   removing the slurry from the surface of the process layer;
   planarizing the surface of the process layer using a substantially slurryless second polishing process that is comprised of a second polishing pad, the second polishing pad being more abrasive than the first polishing pad;
   measuring a surface non-uniformity of the process layer; and
   determining a duration of the second polishing process based on the measured surface non-uniformity.

2. The method of claim 1, wherein determining a duration of the second polishing process comprises increasing the duration of the second polishing process if the measured surface non-uniformity of the process layer exceeds a predetermined threshold.

3. The method of claim 1, wherein determining a duration of the second polishing process comprises decreasing the duration of the second polishing process if the measured surface non-uniformity of the process layer is below a predetermined threshold.

4. The method of claim 1, wherein measuring a surface non-uniformity of the process layer comprises measuring the surface non-uniformity using ellipsometery.

5. The method of claim 1, wherein removing the slurry from the surface of the process layer comprises:
   capturing the slurry from the first polishing process using a slurry re-circulation loop; and
   replacing the first polishing pad with the second polishing pad.

6. The method of claim 1, wherein removing the slurry from the surface of the process layer comprises:
   attaching the second polishing pad to a secondary platen; and
   moving the at least one wafer to the secondary platen.

7. The method of claim 1, wherein polishing a surface of the process layer using a first polishing process comprises polishing the surface of the process layer for approximately 60–90 seconds.

8. The method of claim 1, wherein planarizing the surface of the process layer using a second polishing process comprises polishing a thicker portion of the process layer to at least partially reduce dishing non-uniformity of the process layer.

9. The method of claim 1, wherein planarizing a surface of the process layer using a second polishing process comprises polishing the surface of the process layer for approximately 30–60 seconds.

10. The method of claim 1, further comprising:
    determining a post-polish surface non-uniformity of the process layer; and
    polishing the post-polish surface of the process layer using a third polishing process if the determined post-polish surface non-uniformity of the process layer exceeds a predetermined threshold.

11. A method, comprising:
    providing at least one wafer for polishing;
    polishing a processing surface of the at least one wafer using a first polishing process that is comprised of a slurry and a first polishing pad;
    removing the slurry from the processing surface of the at least one wafer;
    planarizing the processing surface of the at least one wafer using a substantially slurryless second polishing process that is comprised of a second polishing pad, the second polishing pad being more abrasive than the first polishing pad;
    measuring a surface non-uniformity of the processing surface of the wafer; and
    determining a duration of the second polishing process based on the measured surface non-uniformity.

12. The method of claim 11, wherein determining a duration of the second polishing process comprises increasing the duration of the second polishing process if the measured surface non-uniformity of the processing surface exceeds a predetermined threshold.

13. The method of claim 12, wherein determining a duration of the second polishing process comprises decreasing the duration of the second polishing process if the measured surface non-uniformity of the processing surface is below a predetermined threshold.

14. The method of claim 11, wherein removing the slurry from the surface of the processing surface of the wafer comprises:
    capturing the slurry from the first polishing process using a slurry re-circulation loop; and
    replacing the first polishing pad with the second polishing pad.

15. The method of claim 11, wherein removing the slurry from the surface of the processing surface of the wafer comprises:
    attaching the second polishing pad to a secondary platen; and
    moving the at least one wafer to the secondary platen.

16. The method of claim 11, further comprising:
    determining a post-polish surface non-uniformity of the processing surface of the wafer; and
    polishing the post-polish surface of the wafer using a third polishing process if the determined post-polish surface non-uniformity of the processing surface exceeds a predetermined threshold.

17. A system, comprising:
    a polishing tool for polishing wafers, the polishing tool being adapted to:
        receive at least one wafer having a process layer formed thereon;
        polish a surface of the process layer using a first polishing process that is comprised of a slurry and a first polishing pad;
        remove the slurry from the surface of the process layer; and
        planarize the surface of the process layer using a substantially slurryless second polishing process that is comprised of a second polishing pad, the second polishing pad being more abrasive than the first polishing pad; and
    a process controller coupled to the polishing tool, the process controller being adapted to:
        communicate with at least one of a slurry controller and the polishing tool;
        receive measured surface non-uniformity data from a measuring tool; and
        determine a duration of the second polishing process based upon the measured surface non-uniformity data.

18. The system of claim 17, wherein the process controller is adapted to increase the duration of the second polishing process if the measured surface non-uniformity of the process layer exceeds a predetermined threshold.

19. The system of claim 17, wherein the process controller is adapted to decrease the duration of the second polishing process if the measured surface non-uniformity of the process layer is below a predetermined threshold.

20. The system of claim 17, further comprising a slurry controller that is coupled to the process controller, the slurry controller being adapted to:
   remove the slurry from the surface of the process layer using a slurry re-circulation loop based on a signal received from the process controller; and
   initiate a process that replaces the first polishing pad with the second polishing pad.

21. The system of claim 17, further comprising a secondary platen for polishing the process layer during the second polishing process.

22. The system of claim 17, further comprising at least on measuring tool for measuring a post-polish surface non-uniformity of the process layer, the process controller being adapted to:
   receive measured post-polish surface non-uniformity data from the measuring tool;
   determine whether the measured post-polish surface non-uniformity of the process layer exceeds a predetermined threshold; and
   send a signal to the polishing tool initiating a third polishing process if the measured post-polish surface non-uniformity of the process layer exceeds the predetermined threshold.

23. A computer readable program storage device encoded with instructions that, when executed by a computer, performs a method for controlling a polishing tool in a manufacturing process, comprising:
   providing at least one wafer having a process layer formed thereon;
   polishing a surface of the process layer using a first polishing process that is comprised of a slurry and a first polishing pad;
   removing the slurry from the surface of the process layer;
   planarizing the surface of the process layer using a substantially slurryless second polishing process that is comprised of a second polishing pad, the second polishing pad being more abrasive than the first polishing pad;
   measuring a surface non-uniformity of the process layer; and
   determining a duration of the second polishing process based on the measured surface non-uniformity.

24. The computer readable program storage device encoded with instructions that, when executed by a computer, performs the method described in claim 23, wherein determining a duration of the second polishing process further comprises increasing the duration of the second polishing process if the measured surface non-uniformity of the process layer exceeds a predetermined threshold.

25. The computer readable program storage device encoded with instructions that, when executed by a computer, performs the method described in claim 23, wherein determining a duration of the second polishing process further comprises decreasing the duration of the second polishing process if the measured surface non-uniformity of the process layer is below a predetermined threshold.

26. The computer readable program storage device encoded with instructions that, when executed by a computer, performs the method described in claim 23, wherein removing the slurry from the surface of the process layer further comprises:
   capturing the slurry from the first polishing process using a slurry re-circulation loop; and
   replacing the first polishing pad with the second polishing pad.

27. The computer readable program storage device encoded with instructions that, when executed by a computer, performs the method described in claim 23, wherein removing the slurry from the surface of the process layer further comprises:
   attaching the second polishing pad to a secondary platen; and
   moving the at least one wafer to the secondary platen.

28. The computer readable program storage device encoded with instructions that, when executed by a computer, performs the method described in claim 23, wherein planarizing the surface of the process layer using a second polishing process further comprises polishing a thicker portion of the process layer to at least partially reduce dishing non-uniformity of the process layer.

29. The computer readable program storage device encoded with instructions that, when executed by a computer, performs the method described in claim 23, further comprising:
   determining a post-polish surface non-uniformity of the process layer; and
   polishing the post-polish surface of the process layer using a third polishing process if the determined post-polish surface non-uniformity of the process layer exceeds a predetermined threshold.

30. A system, comprising:
   means for receiving at last one wafer having a process layer formed thereon;
   means for polishing a surface of the process layer using a first polishing process that is comprised of a slurry and a first polishing pad;
   means for removing the slurry from the surface of the process layer;
   means for planarizing the surface of the process layer using a substantially slurryless second polishing process that is comprised of a second polishing pad, the second polishing pad being more abrasive than the first polishing pad;
   means for measuring a surface non-uniformity of the process layer; and
   means for determining a duration of the second polishing process based on the measured surface non-uniformity.

31. A method, comprising:
   providing at least one wafer having a process layer formed thereon;
   polishing a surface of the process layer using a first polishing process that is comprised of a slurry and a first polishing pad;
   removing the slurry from the surface of the process layer by capturing the slurry from the first polishing process using a slurry re-circulation loop and replacing the first polishing pad with a second polishing pad; and
   planarizing the surface of the process layer using a substantially slurryless second polishing process that is comprised of the second polishing pad, the second polishing pad being more abrasive than the first polishing pad.

32. A method, comprising:

providing at least one wafer for polishing;

polishing a processing surface of the at least one wafer using a first polishing process that is comprised of a slurry and a first polishing pad;

removing the slurry from the processing surface of the at least one wafer by capturing the slurry from the first polishing process using a slurry re-circulation loop and replacing the first polishing pad with a second polishing pad; and planarizing the processing surface of the at least one wafer using a substantially slurryless second polishing process that is comprised of the second polishing pad, the second polishing pad being more abrasive than the first polishing pad.

33. A system, comprising:

a polishing tool for polishing wafers, the polishing tool being adapted to:

receive at least one wafer having a process layer formed thereon;

polish a surface of the process layer using a first polishing process that is comprised of a slurry and a first polishing pad;

remove the slurry from the surface of the process layer; and planarize the surface of the process layer using a substantially slurryless second polishing process that is comprised of a second polishing pad, the second polishing pad being more abrasive than the first polishing pad;

a process controller coupled to the polishing tool, the process controller being adapted to communicate with at least one of a slurry controller and the processing tool; and a slurry controller that is coupled to the process controller, the slurry controller being adapted to:

remove the slurry from the surface of the process layer using a slurry re-circulation loop based on a signal received from the process controller; and initiate a process that replaces the first polishing pad with the second polishing pad.

34. A computer readable program storage device encoded with instructions that, when executed by a computer, performs a method for controlling a polishing tool in a manufacturing process, comprising:

providing at least one wafer having a process layer formed thereon;

polishing a surface of the process layer using a first polishing process that is comprised of a slurry and a first polishing pad;

removing the slurry from the surface of the process layer by capturing the slurry from the first polishing process using a slurry re-circulation loop and replacing the first polishing pad with a second polishing pad; and planarizing the surface of the process layer using a substantially slurryless second polishing process that is comprised of the second polishing pad, the second polishing pad being more abrasive than the first polishing pad.

* * * * *